United States Patent
Benammar et al.

(10) Patent No.: US 9,634,797 B2
(45) Date of Patent: *Apr. 25, 2017

(54) METHOD OF TRANSMITTING A DIGITAL SIGNAL FOR A SEMI-ORTHOGONAL MS-MARC SYSTEM, AND A CORRESPONDING PROGRAM PRODUCT AND RELAY DEVICE

(71) Applicant: Orange, Paris (FR)

(72) Inventors: Meryem Benammar, Orsay (FR); Atoosa Hatefi, Paris (FR); Raphael Visoz, Vanves (FR)

(73) Assignee: ORANGE, Paris (FR)

( * ) Notice: Subject to any disclaimer, the term of this patent is extended or adjusted under 35 U.S.C. 154(b) by 142 days.

This patent is subject to a terminal disclaimer.

(21) Appl. No.: 14/367,719

(22) PCT Filed: Dec. 20, 2012

(86) PCT No.: PCT/FR2012/053025
§ 371 (c)(1),
(2) Date: Jun. 20, 2014

(87) PCT Pub. No.: WO2013/093359
PCT Pub. Date: Jun. 27, 2013

(65) Prior Publication Data
US 2015/0067454 A1 Mar. 5, 2015

(30) Foreign Application Priority Data

Dec. 21, 2011 (FR) ..................................... 11 62201

(51) Int. Cl.
*H03M 13/03* (2006.01)
*G06F 11/00* (2006.01)
(Continued)

(52) U.S. Cl.
CPC ...... *H04L 1/0041* (2013.01); *H03M 13/2792* (2013.01); *H04L 1/005* (2013.01);
(Continued)

(58) Field of Classification Search
CPC ............ H03M 13/2792; H04L 1/0041; H04L 1/0048; H04L 1/005; H04L 1/0061; H04L 5/0023; H04L 5/0032; H04L 2001/0097
(Continued)

(56) References Cited

U.S. PATENT DOCUMENTS 5,983,383 A 11/1999 Wolf
8,401,105 B2* 3/2013 Mueck ................. H04B 7/0413
375/267
(Continued)

OTHER PUBLICATIONS

English translation of the Written Opinion of the International Searching Authority, dated Jun. 21, 2014 for corresponding International Application No. PCT/FR2012/053025, filed Dec. 20, 2012.
(Continued)

*Primary Examiner* — Christine Tu
(74) *Attorney, Agent, or Firm* — David D. Brush; Westman, Champlin & Koehler, P.A.

(57) ABSTRACT

A method for semi-orthogonal transmission of a signal intended for a system with N sources, M relays and a single receiver whereby the simultaneous transmission on a same spectral resource by the relays is successive and not simultaneous to a simultaneous transmission on a same spectral resource by the sources. The includes, by relay: joint iterative detection/decoding of messages transmitted respectively by the sources to obtain decoded messages, detecting errors on the decoded messages, interleaving the detected messages without errors followed by algebraic network coding consisting of a linear combination in a finite group of an order strictly higher than two of the interleaved messages to obtain a coded message, the linear combinations being
(Continued)

independent, two by two, between the relays of the system, and formatting including channel coding to generate a signal representative of the network coded message.

15 Claims, 7 Drawing Sheets

(51) Int. Cl.
  *H04L 1/00* (2006.01)
  *H04L 5/00* (2006.01)
  *H03M 13/27* (2006.01)
(52) U.S. Cl.
  CPC .......... *H04L 1/0048* (2013.01); *H04L 1/0061* (2013.01); *H04L 5/0023* (2013.01); *H04L 5/0032* (2013.01); *H04L 2001/0097* (2013.01)
(58) Field of Classification Search
  USPC ............... 714/807, 701, 772, 780, 781, 793; 375/352, 240.27, 227, 224
  See application file for complete search history.

(56) References Cited

U.S. PATENT DOCUMENTS

| | | | |
|---|---|---|---|
| 8,787,243 B2* | 7/2014 | Yokomakura | H04B 7/15521 370/315 |
| 2011/0182187 A1 | 7/2011 | Jeong et al. | |
| 2012/0320821 A1 | 12/2012 | Sun et al. | |
| 2014/0331111 A1* | 11/2014 | Kroeger | G06F 11/1004 714/807 |

OTHER PUBLICATIONS

International Search Report and Written Opinion dated Feb. 25, 2013 for corresponding International Application No. PCT/FR2012/053025, filed Dec. 20, 2012.

Atoosa Hatefi et al., "Full Diversity Distributed Coding for the Multiple Access Half-Duplex Relay Channel", Network Coding (NETCOD), 2011 International Symposium on, IEEE, Jul. 25, 2011 (Jul. 25, 2011), pp. 1-6, XP031928315.

Atoosa Hatefi et al., "Joint Channel-Network Coding for the Semi-Orthogonal Multiple Access Relay Channel", Vehicular Technology Conference Fall (VTC 2010-Fall), 2010 IEEE 72nd, IEEE, Piscataway, NJ, USA, Sep. 6, 2010 (Sep. 6, 2010), pp. 1-5, XP031770127.

French Search Report and Written Opinion dated Jun. 25, 2012 for corresponding French Application No. 1162201, filed Dec. 21, 2011.

Jun Zhang et al., "Multiple-Source Multiple-Relay Cooperation System", Communications, 2006. ICC '06. IEEE International Conference on, IEEE, PI, Jun. 1, 2006 (Jun. 1, 2006), pp. 3735-3740, XP031025899.

L. Bahl et al., "Optimal Decoding of Linear Codes for minimizing symbol error rate", IEEE Transactions on Information Theory, vol. IT 20(2), pp. 284-287, Mar. 1974.

Ming Xiao et al., "Design of Network Codes for Multiple Users Multiple Relays Wireless Networks", IEEE International Symposium on Information Theory, 2009.

Hui Zhi et al., "Cooperative Transmission Protocols Based on Decode- and -Forward Relaying and Multiuser Detection in CDMA Systems", Wireless Communications, Networking and Mobile Computing (WICOM), 2011 7h International Conference in IEEE, Sep. 23, 2011 (Sep. 23, 2011), pp. 1-5, XP032059582.

Hausl C., "Joint-Network-Channel Coding for the Multiple-Access Relay Channel Based on Turbo Codes", European Transactions on Telecommunications, Wiley & Sons, Chichester, GB, vol. 20, No. 2, Mar. 1, 2009 (Mar. 1, 2009), pp. 175-181, XP001521162.

Peng Huo et al., "Cooperative Communications with Multiple Sources and Relays in Ad-Hoc Networks", Wireless communications Networking and Mobile Computing (WICOM), 2010 6th International Conference on, IEEE, Piscataway, NJ, USA, Sep. 23, 2010 (Sep. 23, 2010), pp. 1-4, XP031828297.

\* cited by examiner

METHOD OF TRANSMITTING A DIGITAL SIGNAL FOR A SEMI-ORTHOGONAL MS-MARC SYSTEM, AND A CORRESPONDING PROGRAM PRODUCT AND RELAY DEVICE

CROSS-REFERENCE TO RELATED APPLICATIONS

This Application is a Section 371 National Stage Application of International Application No. PCT/FR2012/053025, filed Dec. 20, 2014, which is incorporated by reference in its entirety and published as WO 2013/093359 on Jun. 27, 2013, not in English.

FIELD OF THE INVENTION

The present invention relates to the field of telecommunications. Within this field, the invention relates more particularly to transmitting coded data in a multi-source-multi-relay (MS-MR) network. An MS-MR network is a telecommunications system that, for a given destination, comprises at least four nodes: at least two sources and at least two relays. The invention relates to network coding. It relates to improving the quality of data transmission, and in particular to improving the performance of error-correcting decoding at the destination.

The invention applies particularly, but not exclusively, to transmitting data via mobile networks, e.g. for real time applications.

PRIOR ART

Networks, and in particular mobile networks, seek to find significant improvements in terms of capacity, reliability, consumption, etc. The transmission channel of a mobile network has the reputation of being difficult and it leads to transmission reliability that is relatively mediocre. Considerable progress has been made over the last few years in terms of coding and modulation, in particular for considerations of consumption and capacity. In a mobile network in which a plurality of sources and destinations are sharing the same resources (time, frequency, and space), it is necessary to keep transmission power as low as possible.

Low power goes against coverage and thus against the capacity of the system and more generally against its performance.

In order to increase coverage, to make communications more reliable, and more generally to improve performance, one approach consists in relying on relays for increasing spectrum efficiency and thus for improving the efficiency of transmission and the reliability of systems.

The basic topology of an MS-MR system is shown in FIG. 1 and is such that the sources, nodes $S_1$ and $S_2$, broadcast their code information sequences for the attention of relays $R_1$ and $R_2$ and of the destination D; the sources are typically user terminals seeking to reach the same base station with the help of relays. Each relay decodes the signals it receives coming from the sources $S_1$ to $S_2$ and jointly re-encodes the sequences obtained by the decoding, while also adding their own redundancy, thereby creating a network code. At the destination D, the spatially-distributed code sequences, comprising the received code sequences coming directly from the sources $S_1$ and $S_2$ and the code sequences coming from the relays $R_1$ and $R_2$ are decoded by means of channel decoding algorithms and network decoding algorithms.

Network coding is a form of co-operation in which the nodes of the network share not only their own resources (power, bandwidth, etc.) but also their calculation capacity in order to create a distributed code of ever increasing power as the information propagates through the nodes. This leads to substantial gains in terms of diversity and of coding, and thus in terms of transmission reliability.

A major difficulty lies in the links from the sources to the relays not always enabling all of the relays to detect the messages from the sources without error on the basis of the signals they receive. This difficulty may be encountered for example in a transmission channel from sources to relays that suffers from Rayleigh fading and in the absence of knowledge about the channel at the sources. Under such circumstances, there exists a non-zero probability of outage, with the relays decoding the messages from the sources imperfectly. Such imperfection can lead to errors propagating towards the destination.

In addition, achieving maximum diversity means that it must be possible to recover all of the messages from the sources even in the event of outages on a number of links equal to the number of relays.

Article [1] mentions a network code for a simple MS-MR system as shown in FIG. 1. That MS-MR system corresponds to the basic topology. The system is limited to two sources and two relays. The MS-MR system under consideration is such that all of the source-to-destination and relay-to-destination links are orthogonal and use different spectrum resources (i.e. the radio resources used between the sources and the relays are separate in time or in frequency). This separation leads to a loss of spectrum efficiency since the radio resource is subdivided among a plurality of users.

The two sources $S_1$ and $S_2$ broadcast the coded information to the relays $R_1$, $R_1$ and to the destination D. The relays $R_1$ and $R_2$ take the streams that are assumed to be perfectly decoded from the two users, and combine them in linear manner using a linear network coding scheme defined in a finite field of order 4. That network code enables the maximum diversity to be achieved, which is three (M+1), since any pair of two codes taken from the four codes I1, I2, I+I2, and I1+2I2 suffices to reconstitute the messages I1 and I2 coming from the sources, in the event of outage in two links.

In that system, decoding errors can be reduced solely in the absence of interference, since the MS-MR system under consideration is purely theoretical and is assumed to suffer from no interference because the links are completely orthogonal. In addition, the constraints that consist in imposing links that are completely orthogonal lead to non-optimum use of the spectrum resource, and thus to a limit on the capacity of the network.

The relays of MS-MR systems may equally well be fixed relays or mobile relays. Given the density of communications to be transmitted in densely populated areas, the number of relays may be large and much greater than two. In order to cover such zones, it may be preferable to use fixed relays rather than base stations since base stations can be considerably more expensive. In alternative manner, it is possible to use mobile relays. Such mobile relays are typically mobile terminals. Such an MS-MR system becomes very complex and a transmission method in accordance with [1] consumes a large amount of resources, thereby making the system relatively unattractive.

MAIN CHARACTERISTICS OF THE INVENTION

The invention provides a method of semi-orthogonal transmission of a signal, for use in a system having N sources, M relays, and a single receiver, wherein simultaneous transmission over a common spectrum resource by the relays takes place successively and non-simultaneously with simultaneous transmission over the same spectrum resource by the sources, the method comprising for each relay:

a step of iterative joint detection and decoding of messages transmitted respectively by the sources to obtain decoded messages;

a step of detecting errors in the decoded messages;

a step of interleaving the messages that are detected without error, followed by a step of algebraic network coding consisting in a linear combination in a finite field of order strictly greater than two of the interleaved messages to obtain a coded message, the linear combinations being independent in pairs between the relays of the system; and a step of shaping comprising channel coding to generate a signal representative of the network coded message.

Such transmission of the invention is adapted to a system having at least two relays that relay messages coming from at least two sources to a single destination. The system is said to be multi-user and multi-relay. The transmission protocol is said to be semi-orthogonal since it takes place in two stages. During the first stage, the sources transmit simultaneously while occupying a common spectrum resource. The relays and the destination listen, detect, and decode. The signals that are transmitted interfere both at the relays and at the destination. During the second stage, the sources are silent, and the relays transmit simultaneously while also occupying the same spectrum resource. The transmitted signals interfere at the destination. The source-to-relay links, the relay-to-destination links, and the source-to-destination links are non-orthogonal. The use of the term semi-orthogonal comes from the two stages of transmission that avoid any interference at the destination between signals coming from the sources and signals coming from the relays.

The network coding advantageously makes it possible to reach the maximum order of diversity, which is M+1 for a system having M relays; the maximum order is given by the number of different paths that can be followed by the signals transmitted by one of the sources towards the destination (the direct path and the M paths via each of the M relays). The independence in pairs of the linear combinations defined in a finite field of order greater than two as used by the relays makes it possible to reach an order of diversity equal to M+1, since eliminating the M links from among the M+1 links enables the destination always to find the source signals, given the irreversible nature of the constructed linear system.

In a prior art system having two relays, the use of an XOR function ($\oplus$) at each of the relays for performing the combination does not enable maximum diversity to be achieved. When the two source-to-destination links suffer an outage, it is not possible at the destination to reconstitute the messages I1 and I2 coming from the two sources on the basis of the messages I1$\oplus$I2 coming from the relays. The information I1$\oplus$I2 received at the destination coming from the relays does not enable either I1 or I2 to be reconstituted in the absence of information I1 or I2 received directly from the sources. Unlike the techniques known from the prior art, the invention is adapted to any number of relays greater than or equal to two.

The invention makes it possible to maximize spectrum efficiency by allowing signals to collide at the relays and at the destination, given simultaneous transmission by the sources over a common spectrum resource and simultaneous transmission by the relays over a common spectrum resource. Thus, the invention takes account not only of the non-orthogonal source-to-relay and source-to-destination links, but also of the non-orthogonal relay-to-destination links. Spectrum efficiency is optimized when the sources and the relays occupy the same resources during their respective transmissions, which corresponds to a particular implementation of the invention.

The invention also makes it possible to perform iterative joint channel and network decoding at the destination, given the interleaving performed by the relays before network coding. Interleaving each message that is received without error reduces the correlation between the channel coding performed at the sources on the same messages when non-interleaved and the channel and network coding performed at the relays on the same messages. Consequently, this ensures that joint channel and network decoding at the destination making use firstly of the signals coming directly from the sources and secondly of the signals coming from the relays is of higher performance than channel decoding performed independently of network decoding.

Relaying in accordance with the invention serves to increase the reliability of transmissions between the sources and the destination, while minimizing the propagation of errors from the relays to the destination, given the adaptive nature of the network coding. Such a method is thus particularly suited to a system deployed in an urban environment in which the transmission channel generally presents a profile with so-called Rayleigh fading. Such fading disturbs the transmitted signal and gives rise to a non-zero probability of erroneous detection (known as the "outage" probability). An adaptive (or selective) relaying method of the invention advantageously makes it possible for a relay not to transmit information if all of the messages it receives are erroneous while also enabling the relay to transmit information representative of a source even if only the message coming from that source is detected without error. The method thus accommodates noisy source-to-relay links.

The invention is particularly adapted to half-duplex relays, but it is equally capable of being applied to full-duplex relays. Co-operative systems making use of half-duplex relays are very attractive because their communications schemes are simpler than for full-duplex relays, because they are easy to implement, and because they are of smaller cost.

The invention also provides a relay for a semi-orthogonal MS-MR system.

Thus, a relay of the invention for implementing a transmission method of the invention comprises:

means for iterative joint detection and decoding to separate the streams coming from the sources and to determine for each stream a message representative of a code word transmitted by a source;

means for detecting errors so as to keep only those messages that are detected without error;

interleaving means for interleaving those messages that are detected without error;

means for algebraic network coding $a_j = [a_{1,j} \ a_{2,j} \ \ldots \ a_{N,j}]^T$ of the interleaved messages; and means for shaping, comprising channel coding of the messages from the network coding to generate a signal representative of the network coded messages.

A relay of the invention is typically of the half-duplex type.

In a particular implementation, a transmission method further comprises a step of shaping a control signal specifying the messages detected without error represented in the representative signal for the signal receiver.

Such a message makes it possible to simplify considerably the processing on reception.

In a particular implementation, a transmission method is such that the channel coding is of the systematic type.

Coding of this type makes it possible very easily to punch the systematic portion of the code and to use the relay to transmit only the parity portion, thereby optimizing spectrum efficiency of the transmission by the relay to the destination.

In a particular implementation, the channel coding is binary and the transmission method further comprises:
- a step of binary-to-symbol conversion between the interleaving step and the algebraic coding step; and
- a step of symbol-to-binary conversion after the algebraic network coding step.

This implementation is particularly adapted to binary source channel coding.

In a particular implementation, a transmission method is such that the finite field of order strictly greater than two is the Galois field of order four.

The order four for the field corresponds to an optimum selection for a number M of relays up to three.

In a particular implementation, the transmission method is such that the step of detecting errors is performed by means of using redundancy information of the cyclic type associated with a message transmitted by a source.

This implementation has the advantage of being particularly simple to perform. It is adapted to systematic type encoding at the source.

In a particular implementation, a transmission method is such that the step of iterative joint detection and decoding jointly performs multi-user detection and soft input and soft output decoding.

This implementation has the advantage of providing better performance than multi-user detection followed by decoding without exchanging a priori information between the detection and the decoding.

In a particular implementation, a transmission method is such that the iterative joint detection and decoding steps implement space-time decoding.

This implementation is particularly adapted to a system in which the sources have a plurality of transmit antennas and perform space-time coding. When the relays are fitted with a plurality of receive antennas, the system is said to be a multiple-input or multiple-output (MIMO) system, otherwise it is said to be a multiple-input or single-output (MISO) system.

In a particular implementation, a transmission method is such that the step of shaping comprises modulating messages before transmission, and interleaving between the channel coding and the modulation.

This implementation provides great flexibility in constructing the modulation and coding scheme, by enabling the modulation and the coding to be selected independently. In addition, the channel interleaver makes it possible to have an iterative method between detection and decoding at the destination and at the relay.

In a particular implementation, a transmission method performs distributed turbo coding between the sources and the relays. The coding step in the sources also makes use of a convolutional coder.

For example, the distributed turbo code is constituted at a source by a recursive systematic convolutional code (RSCC) of coding rate 1/2, and at the relays an RSCC of coding rate 2/3 preceded by an interleaver for each stream from the decoder. Selecting a distributed turbo code with parallel concatenation enables spatially distributed network coding to be implemented very simply for a semi-orthogonal MS-MR system with a half-duplex relay by having by construction a code made up of a concatenation of a systematic portion and two redundancy portions (a first redundancy portion determined and transmitted by a source and a second redundancy portion determined and transmitted by the relays). This concatenation makes it possible for a source to transmit the systematic portion and the first redundancy portion during the first transmission interval, and for the relays to transmit the second redundancy portion during the second transmission interval. This concatenation thus makes it simple to ensure that the relays provide new redundancy information to the information bits corresponding to the systematic portion independently of the first redundancy portion transmitted during the first transmission interval from the sources to the destination. The destination thus has a plurality of redundancies, thereby enabling very powerful decoding to be performed and thus improving reliability.

The invention also provides a reception method for a receiver of a semi-orthogonal MS-MR system for implementing a transmission method of the invention. The reception method comprising in iterative manner:
- a first multi-user detection step of detecting coded messages transmitted simultaneously by the respective sources to obtain soft information about the respective messages coded by the sources;
- a second multi-user detection step of detecting coded messages transmitted respectively by the relays to obtain soft information about the messages coded by the relays;
- a first step of soft channel decoding in parallel of the N messages coded respectively by the N sources; and
- a second step of algorithmic soft network decoding in cascade of the M messages coded respectively by the M relays under the control of information about the messages detected without error by the relays;

the first step of soft channel decoding N messages uses as a priori information the soft information coming from the first detection step in order to provide the soft information about the M messages decoded in the second step of algebraic soft network decoding;

the second step of soft network decoding M messages uses as a priori information the soft information coming from the first and second detection steps to respond by supplying soft information about the decoded messages to the second detection step;

the first step of soft channel decoding N messages and the second step of soft network decoding M messages supplying each other mutually with extrinsic information, this mutual supply being under the control of information coming from the relays identifying which messages were detected without error by the relays.

The invention also provides a receiver for a semi-orthogonal MS-MR system for implementing a transmission method of the invention. The receiver comprises:
- first detection means for multi-user joint detection to separate the simultaneous streams of coded messages coming respectively from the N sources during a first stage of transmission and to generate soft information about the coded messages;
- second detection means for multi-user joint detection to separate the simultaneous streams of coded messages coming respectively from the M relays during a second stage of transmission and to generate soft information about the coded messages coming respectively from the relays;

as many soft decoders in parallel as there are sources for soft decoding of the messages coded respectively by the sources while using as a priori information the soft information coming from the first detection means and to generate soft information about the decoded messages;

as many soft algebraic decoders operating in cascade as there are relays for soft decoding of the messages coded respectively by the relays while using as a priori information the soft information coming from the first and second detection means and to respond by supplying soft information about the decoded messages to the second detection means;

the N soft channel decoders and the M soft algebraic decoders supplying each other mutually with extrinsic information, this mutual supply being under the control of information coming from the relays identifying which messages were detected without error by the relays;

decision-taking means for the channel decoders to obtain an estimate of the messages coming respectively from the sources.

This reception method and this receiver have the advantage of being adapted to a semi-orthogonal MS-MR system implementing a transmission method of the invention.

Each of the above-described implementations may optionally be combined with one or more of the other implementations in order to define yet more implementations.

The invention also provides an optionally MIMO semi-orthogonal MS-MR system adapted to implement the method of the invention.

Thus a semi-orthogonal MS-MR system of the invention includes at least two relays of the invention.

In a preferred implementation, the steps of the transmission method and/or of the reception method are determined by instructions of a transmission and/or a reception program incorporated in one or more electronic circuits, themselves suitable for being arranged in electronic devices of the semi-orthogonal MS-MR system. The transmission and/or reception method of the invention may also be performed when the program is loaded into a calculation member such as a processor or the equivalent with its operation then being controlled by executing the program.

Consequently, the invention also applies to a computer program, in particular a computer program on or in a data medium, and suitable for performing the invention. The program may use any programming language, and being in the form of source code, object code, or code intermediate between source code and object code, such as in a partially compiled form, or in any other desirable form for implementing a method of the invention.

The data medium may be any entity or device capable of storing the program. By way of example, the medium may comprise storage means such as a read-only memory (ROM), e.g. a compact disk (CD) ROM, or a microelectronic circuit ROM, or indeed magnetic recording means, e.g. a hard disk or a universal serial bus (USB) key.

Alternatively, the data medium may be an integrated circuit in which the program is incorporated, the circuit being adapted to execute or to be used in the execution of the method in question.

Furthermore, the program may be converted into a transmissible form such as an electrical or optical signal, which may be conveyed via an electrical or optical cable, by radio, or by other means. The program of the invention may in particular be downloaded from an Internet type network.

LIST OF FIGURES

Other characteristics and advantages of the invention appear more clearly on reading the following description of preferred methods given merely as illustrative and non-limiting examples, and with reference to the accompanying drawings, in which.

DESCRIPTION OF PARTICULAR IMPLEMENTATIONS

The following notation is used in this application.

All vectors use bold characters. A vector v has its $k^{th}$ element written [v]k, or $v_k$.

$F_q$ is the q-element Galois field, $\mathbb{R}$ is the field of real numbers and $\mathbb{C}$ is the field of complex numbers.

Matrices/tensors use capital letters in bold. If X is a matrix of dimensions N×M belonging to the field E, i.e. $X \in E^{N \times M}$ then $x_k$ denotes its $k^{th}$ column (k=1, . . . , M).

Functions use non-italic capital letters. A multi-dimensional function F is applied to input in the form of a matrix A of dimensions m×q, where each element $a_{i,j}$ (for all i=1, ..., m and j=1, ..., q) belongs to the set E, and it outputs a matrix B of dimensions n×p in which each element $b_{i,j}$ (for all i=1, ..., n and j=1, ..., p) belonging to the set G, such that F(A)=B written: $F:E^{m \times q} \to G^{n \times p}$.

The probability density of a complex random variable x with circularly symmetrical Gaussian distribution of mean $\mu_x$ and covariance $\sigma_x^2$ is written: $CN(\mu_x, \sigma_x^2)$.

Figure 1:
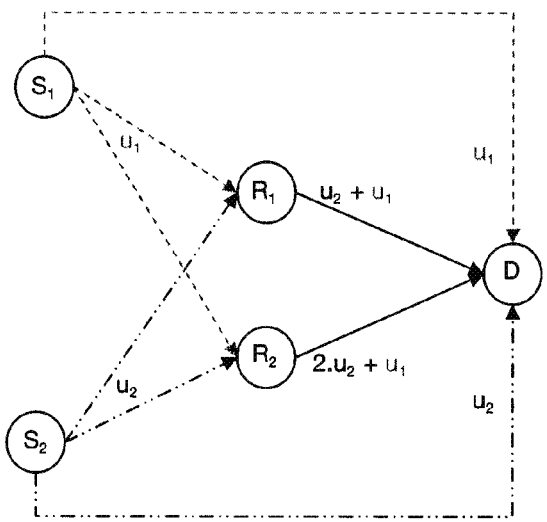
FIG. 1 shows an example of a prior art MS-MR system with orthogonal links between the various nodes.
Figure 2:
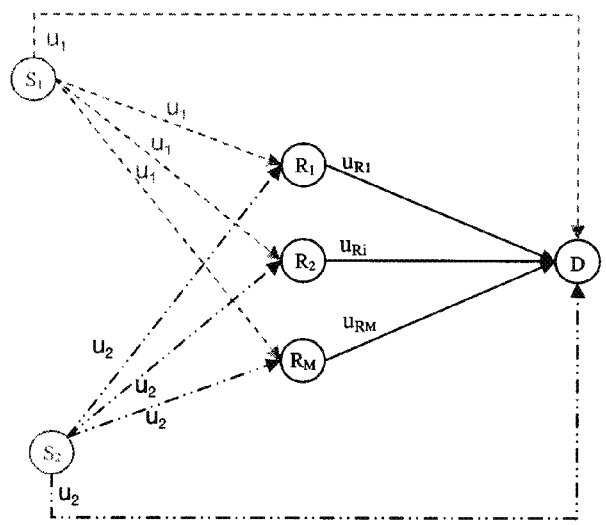
FIG. 2 is a diagram showing the topology of MS-MR systems having N sources $S_1, \ldots, S_N$ and M relays $R_1, \ldots, R_N$, for a receiver D.

A transmission of the invention is implemented in MS-MR systems having the topology shown in FIG. 2. This topology is such that the sources, nodes $S_i$, i∈{1, ..., N} broadcast their coded information sequences for the attention of relays $R_j$, j∈{1, ..., M} and of the destination D; the sources are typically user terminals seeking to reach the same base station with the help of relays. Each relay decodes the signals received from the sources $S_1$ to $S_N$ and re-encodes the decoded sequences jointly while adding its own redundancy so as to create a network code. At the destination D, the spatially-distributed code sequences comprising the code sequences received directly from the N sources and the code sequences from the M relays are decoded by channel decoding algorithms and by network decoding algorithms.

Figure 3A:
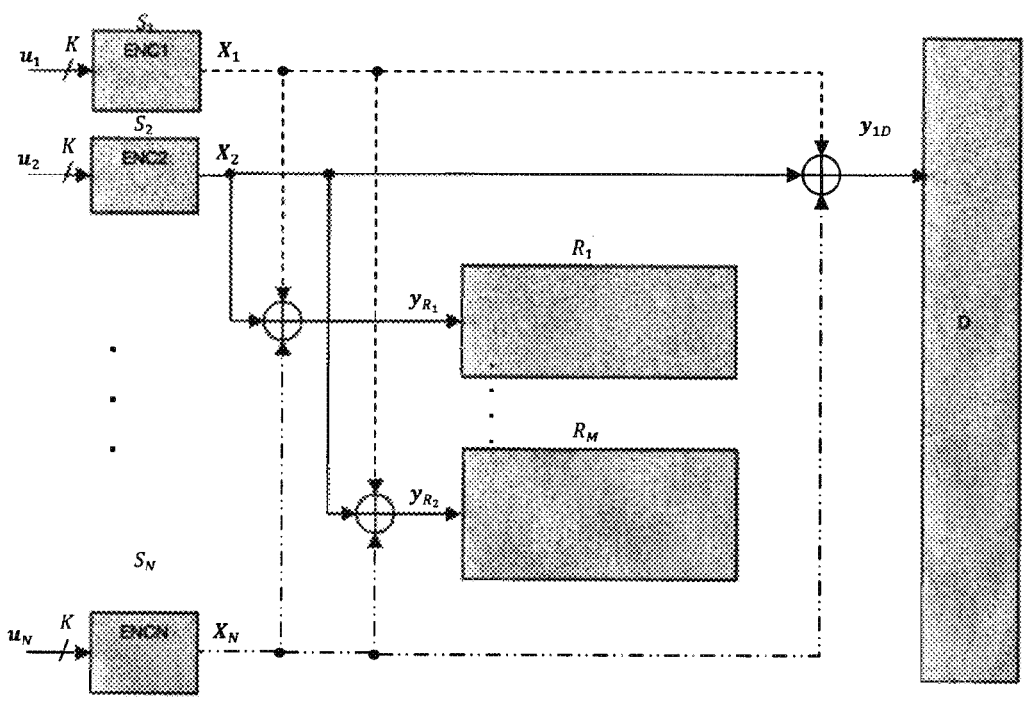
FIG. 3a is a diagram of a semi-orthogonal MS-MR system of the invention such that the links are non-orthogonal between the sources and the relays, between the sources and the destination, the figure showing the first stage of transmission.
Figure 3B:
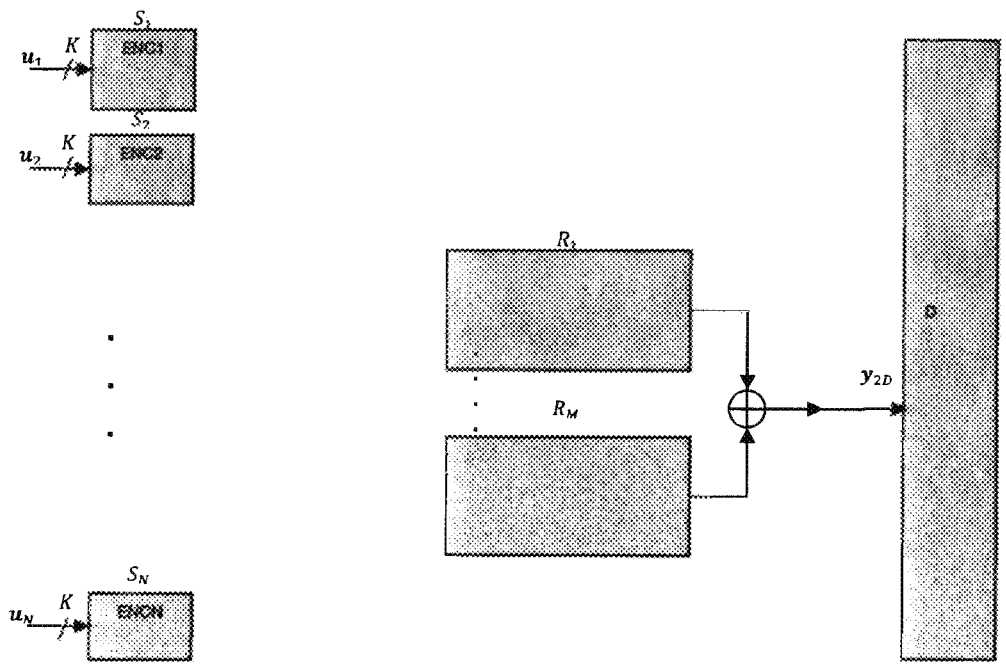
FIG. 3b is a diagram of a semi-orthogonal MS-MR system of the invention such that the links are non-orthogonal between the relays and the destination, the figure showing the second stage of transmission.

The invention uses relays with a new semi-orthogonal transmission protocol as shown in FIGS. 3a and 3b to improve the spectrum efficiency of transmission while making simple and effective decoding possible at the destination. FIG. 3a shows the first stage of transmission during which only the sources transmit simultaneously to the relays and to the destination. During this stage, the relays are silent. FIG. 3b shows the second stage of transmission during which the sources are silent and the relays transmit simultaneously to the destination.

Figure 4:
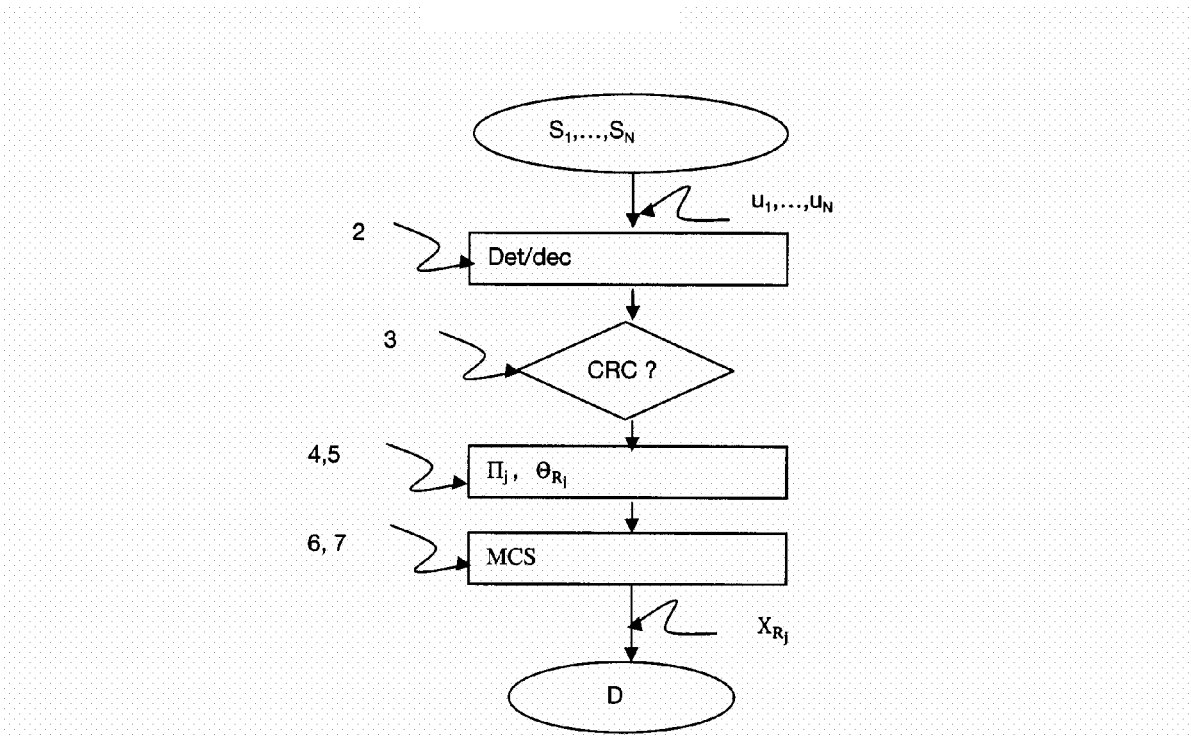
FIG. 4 is a simplified flow chart of the transmission method of the invention as implemented by a semi-orthogonal MS-MR system shown in FIG. 3.

Thus, a method 1 of the invention is as shown in FIG. 4.

There is no constraint on the transmission channel; it may suffer from fast fading, with the coefficients of the matrices representing the transmission channel changing on each occasion the channel is used, or it may have slow B-block fading in which the coefficients remain constant over N/B consecutive uses (block) of the channel but change from one block to another, and the channel may be frequency selected, and it may be a MIMO channel. The notations adopted in the description below correspond to a slow 1-block fading channel, i.e. a channel that is quasi-static.

In the description below, the nodes (sources, relays, and destination) are assumed to be perfectly synchronized and the sources are independent (there is no correlation between them).

The semi-orthogonal transmission protocol is such that the transmission of information to the destination takes place over $N_{use}$ uses of the channel arranged in two stages: in a first stage, the sources transmit during $\alpha N_{use}=Ch_{use}$ uses of the channel, and in a second stage the relays transmit during $(1-\alpha)N_{use}=Ch_{useR}$ uses of the channel.

In a first aspect of the invention, the semi-orthogonal transmission method 1 of transmitting a signal is performed by the relays $R_j$ of the system.

A source data block $u_i \in F_q^K$, i∈{1, ..., N} is a message vector of length K in which the components taken their values in a finite field F of integer order q.

The statistically independent sources $S_i$ perform channel coding of the information data $u_i$ while adding a cyclic redundancy check (CRC) to a systematic portion for the purpose of verifying message integrity. The sources $S_i$ having $T_{S_i}$ transmit antennas use a space-time modulation and coding scheme $\Theta_i$ defined on $F_q$ (e.g. the binary field $F_2$ or the four-element finite field $F_4$) that associates every block $u_i$ with coded and modulated symbols $$X_i \in \chi_i^{T_{S_i} \times Ch_{use}}$$

belonging to the complex constellations $\chi_i$ of cardinalities $|\chi_i|=2^{w_i}$, $w_i \in \mathbb{N}$. A symbol of $F_q$ has a binary representation containing $\ln_2(q)$ bits. If the ratio $$s_i = \frac{w_i}{\ln_2(q)}$$

is an integer, it represents the number of symbols of $F_q$ carried by the modulation. The function $\Theta_i$ may be described in the following generic manner:

$$\Theta_i: F_q^K \to \chi_i^{T_{S_i} \times Ch_{use}}.$$

The channel coding and the space-time coding are performed by the coders ENCi.

During the first stage of transmission, the sources transmit the N symbols $X_i$.

Each relay $R_j$ has $N_{R_j}$ receive antennas and $T_{R_j}$ transmit antennas. During the first stage of transmission, each relay receives the disturbed versions of the N source signals transmitted over the source-relay channels. The channel between the sources $S_i$ and a relay $R_j$ is designated by the set of coefficients of the MIMO channel:

$$\{H_{S_i R_j, k, m} \in C^{N_{R_j} \times T_{S_i}}\}.$$

The signal received at the instant k by the relay $R_j$ is expressed in the following form:

$$y_{R_j, k} = \sum_{i=1}^{N} \sum_{m=0}^{L_m} H_{S_i R_j, k, m} X_{i, k-m} n_{R_j, k}, \; k \in \{1, \ldots, Ch_{use}\}$$

where $$n_{R_j, k} \in C^{N_{R_j}}$$

designates the additive noise vector at the relay $R_j$ at the instant k and $L_m$ designates the memory of the channel. The memory effect of the channel is associated with the propagation delay spread. This delay causes transmitted signals to be superposed, thereby giving rise to inter-symbol interference.

The destination has $N_D$ receive antennas. During the first stage of transmission, the destination then receives the disturbed versions of the N source signals transmitted by the source-to-destination channels. Let $$H_{S_i D} \in C^{N_D \times T_{S_i}}$$

be the matrices of fading coefficients associated with the N source-to-destination channels. The signal received by the destination during the first stage of transmission is written:

$$y_{1D,k} = \sum_{i=1}^{N} \sum_{m=0}^{L_m} H_{S_iD,k,m} X_{i,k-m} + n_{1D,k}$$

$$k \in \{1, \ldots, Ch_{use}\}$$

where $n_{1D,k} \in \mathbb{C}^{N_D}$ designates the additive noise vector during the first stage of transmission at the destination at instant k.

Each relay $R_j$ has a multi-user iterative joint detector and decoder for performing turbo multi-user detection or "turbo-MUD" that performs joint detection and decoding 2 in iterative manner on the signals received during the first stage in order to obtain the estimated signal vectors from each source $\hat{u}_i \in F_q^K$. This joint processing relies on observing the received signal representative of all of the source messages as distorted by the channel and on soft input and output decoding of the channel code from each source. An estimate of the message transmitted by each source is available after a certain number of iterations, which number can be set.

The relay $R_j$ then uses CRC detectors in parallel to detect 3 from the redundant portion of the messages any errors that might have occurred in the previously estimated messages. Let $J_j \subset \{1, \ldots, N\}$ be the set of message indices detected without error by the relay $R_j$ of cardinality J.

In parallel, the relay $R_j$ interleaves 4 only the J non-erroneous messages $\hat{u}_i$, $i \in J_j$ with a first type of interleaver $\pi_j$ of size K.

The relay applies 5 a function $\Theta_{R_j}$ to the interleaved messages by means of a network coder ENW in order to obtain the result of the network coding:

$$u_{R_j} = \Theta_{R_j}(\{\hat{u}_i, i \in J_j\}) \in F_q^K$$

The function $\Theta_{R_j}$ linearly combines the interleaved messages in a finite field of dimension strictly greater than two. This linear operation is referred to as network coding. A network code is a linear combination of N source messages received by a relay that can be represented by a vector of dimension N in which each component is non-zero. The network coding associated with the relay $R_j$ is defined by the vector $a_j = [a_{1,j} \, a_{2,j} \, \ldots \, a_{N,j}]^T$ of dimension N. Assuming that this relay detects only J messages without error of indices contained in the set $J_j \subset \{1, \ldots, N\}$, the result of the network coding $u_{R_j}$ is the linear combination $u_{R,j} = \Sigma_{i \in J_j} a_{i,j} \hat{u}_i$. This amounts to zeroing the coefficients $$\{a_{i,j}\}_{i \notin J_j}$$

of the vector $a_j$ having indices that are not included in the set) $J_j$. It is thus possible to define effective network coding for each relay that depends on the source messages that it was not possible to detect without error. In this definition, non-transmission of a relay is an effective network code consisting in a zero vector of dimension N.

In a system having M relays, the order of maximum diversity is M+1. A system having N sources and M relays is said to have maximum diversity if, in the event of outage of any M links from among the NM S-R links and the N+M S-D and R-D links, it is still possible to recover the N messages from the sources (the messages associated with the remaining links are assumed to be detected without error). Let $T=[I_N G]$ be the systematic generator matrix where $I_N$ is the identity matrix of dimension N, and G represents the M vectors of the effective network code of the relays. The vectors $a_j = [a_{1,j} \, a_{2,j} \, \ldots \, a_{N,j}]^T$ of the network code can be determined by randomly drawing in independent manner the components of the vectors after selecting the order of the field to be strictly greater than two. After the draw, it is necessary to verify that maximum diversity has been reached. This makes it necessary to consider all configurations of Q outages among the MN S-R links, $Q \in \{0, 1, \ldots, M\}$ and to make sure that the systematic generator matrix $T=[I_N G]$ satisfies the following conditions: after eliminating M-Q columns from the matrix T, the remaining N+Q columns have the property of having a rank of not less than N. It should be observed that it suffices to test the case Q=0 (no outages in the MN source destination channels), with the validity of the other conditions being mathematically deduced therefrom.

The channel coded messages from the sources and the corresponding messages interleaved by the relays and then subjected to channel coding by the function $\Theta_{R_j}$ forms a distributed turbo code. The interleaving enables the destination to perform iterative joint channel/network decoding based on the signals received from the sources and the relays. When J=1, the linear operation amounts to identity.

The signal resulting from the network coding is shaped 6, 7 by the relay in order to obtain the signal:

$$X_{R_j} \in \mathbb{C}^{T_{R_j} \times Ch_{useR}}.$$

Shaping typically comprises an operation of space-time modulation and coding. The shaper signal $$X_{R_j} \in \mathbb{C}^{T_{R_j} \times Ch_{useR}}$$

is transmitted from the antennas of the relay. The relay $R_j$ informs the destination D of the J messages involved in the network coding by means of an in-band control signal, e.g. consisting in control bits. Alternatively, the relay may indicate which messages were detected with error.

During the second stage of the semi-orthogonal protocol, the relays transmit simultaneously for the same number of uses $Ch_{useR}$ of the channel over the same radio resource and the sources are silent. The signals $X_{R_j}$ transmitted simultaneously by the relays, interfere at the destination. Let $$H_{R_jD} \in \mathbb{C}^{N_D \times T_{R_j}}$$

be the matrices of the coefficients of the M relay-to-destination channels. The signal received at the destination during the second stage is written as follows:

$$y_{2D,k} = \sum_{j=1}^{M} \sum_{m=0}^{L_m} H_{R_jD,k,m} X_{R_j,k-m} + n_{2D,k} \quad k \in \{1, \ldots, Ch_{useR}\},$$

where $n_{2D,k} \in \mathbb{C}^{N_D}$ is the additive noise during the second stage of transmission at the destination at instant k.

The destination observes a superposition of the symbols transmitted by the sources during the first stage of transmission followed by the symbols transmitted by the relays during the second stage. At the end of the second stage of transmission, the destination has signals available to it that come directly from the sources and signals that come from the relays. The destination can then proceed with joint channel network decoding in order to recover the source signals: $u_1 \ldots u_N$ from the received signals.

The space-time modulation and coding schemes at the sources and at the relays are defined either in the binary field or in the field defined by the network coding, i.e. decoding them provides probabilistic information about the representation of the messages from the sources either in the binary field or in the field associated with the network coding.

The description of the invention is given in detail on the basis of particular embodiments of semi-orthogonal MS-MR systems having two sources and two relays. Each source has a transmit antenna, each relay has a receive antenna and a transmit antenna, and the destination has a receive antenna.

Figure 5:
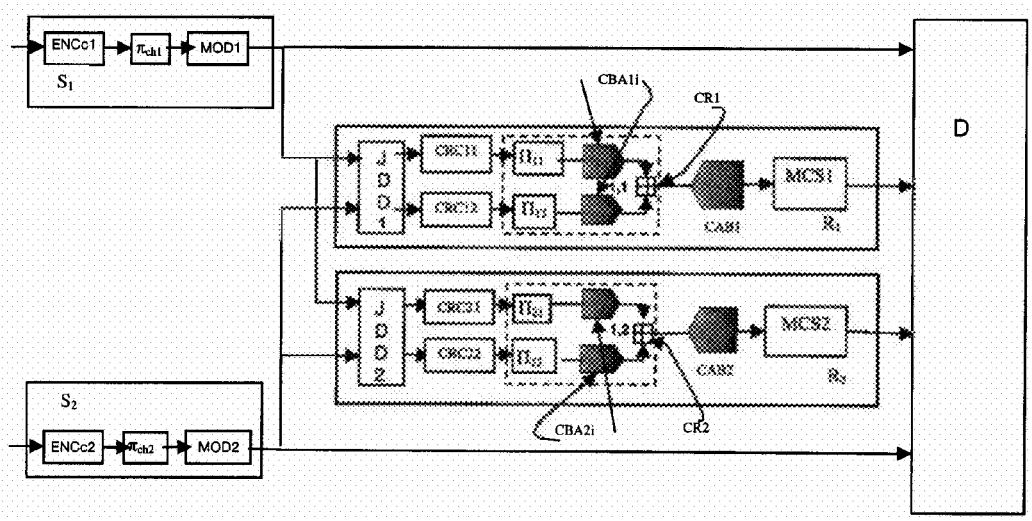
FIG. 5 is a diagram of a first embodiment of an MS-MR system of the invention in which the space-time modulation and coding schemes at the sources and at the relays are defined in the binary field.

In a first embodiment of the invention, the modulation and channel coding at the sources and at the relays are defined in the binary field. An embodiment is shown in FIG. 5. The modulation and coding schemes at the sources and at the relays are based on a scheme of the bit interleaved coded modulation (BICM) type that corresponds to concatenating binary channel coding (defined in the binary field) with binary interleaving and with bit-to-symbol Gray coding (modulation). The channel coding is preferably of the systematic type, e.g. the encoders are based on recursive systematic convolutional (RSC) codes, possibly associated with puncturing.

Each source $S_i$, i=1 or 2, has an encoder ENCci for performing the channel coding on the messages for transmission. A message $u_i \epsilon F_2^K$ is coded as a vector $c_i \epsilon F_2^{n_i}$ where $$\frac{n_i}{K}$$

is the coding rate of the encoder associated with the source $S_i$. The code words $c_i$ are interleaved with a binary interleaver $\pi_{chi}$. The interleaver is necessary for ensuring independence between the coded values by reducing the correlation between the successive code values. The output from the interleaver corresponds to the matrices $V_i \epsilon F_2^{Ch_{use} \times S_i}$.

The interleaved words are modulated by a modulator MODi into sequences $x_i \epsilon C^{Ch_{use}}$ with $2^{S_i}$ being the order of the modulation; the labeling is performed by the following bijective function: $\phi_i : F_2^{S_i} \to X_i$. Let $v_{i,k,l} = \phi_{i,l}^{-1}(x_{i,k})$ be the $l^{th}$ bit corresponding to the modulated symbol $x_{i,k}$ (corresponding to the bits of the source i $\{v_{i,k,l}: l=1, \ldots, s_i\}$).

Each relay $R_j$, j=1 or 2, comprises an iterative joint detector and decoder (or Turbo MUD) JDDj with as many outputs as there are sources $S_i$, an error detector $CRC_{ji}$ on each output of the joint detector and decoder, an interleaver $\pi_{ji}$ after each error detector $CRC_{ji}$, an algebraic network coder $CR_j$ connected to the outputs of the interleavers $\pi_{ji}$, and a shaper module MCSj at the output from the algebraic network coder. In this embodiment, each relay also has as many binary-to-algebraic converters CBAji at the input to the network coding as there are sources together with an algebraic-to-binary converter CABj at the output from the network coding.

Figure 6:
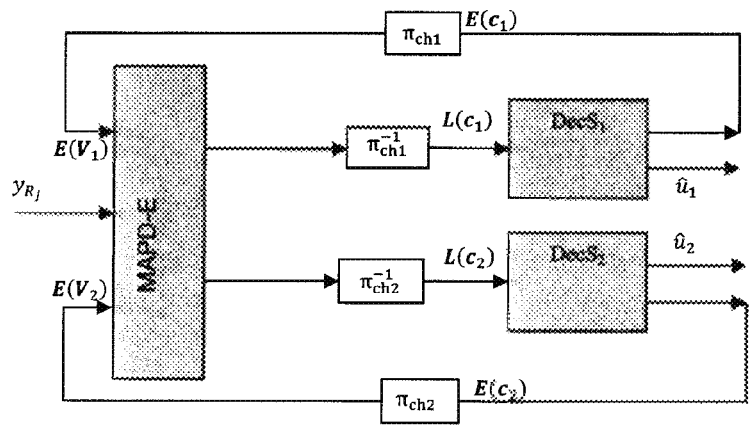
FIG. 6 is a diagram of an iterative joint detector and decoder JDDj that jointly detects and decodes messages transmitted simultaneously by the sources and received by the relay.

Each iterative joint detector and decoder JDDj jointly detects and decodes messages transmitted simultaneously by the sources. It is shown in FIG. 6. It comprises a joint detector MAPD-E, two decoders $DecS_1$, $DecS_2$ corresponding to each of the sources, two interleavers $\pi_{ch1}$, $\pi_{ch2}$ between the output to the decoders and the inputs of the detector, and two deinterleavers $\pi_{ch1}^{-1}$, $\pi_{ch2}^{-1}$ between the outputs from the detector and the inputs of the decoders. The interleavers are of the same type as those used in the sources. The deinterleavers are the inverses of the interleavers. The relay $R_j$ receives a signal $y_{R_j,k}$ resulting from interference between the signals from the two sources $S_i$:

$$y_{R_j,k} = h_{1R_j} x_{1,k} + h_{2R_j} x_{2,k} + n_{R_j,k}, k \epsilon \{1, \ldots, Ch_{use}\}$$

where $n_{R_j,k}$ is additive noise with the distribution $CN(0, \sigma_n^2)$, and $h_{i,R_j}$ is the coefficient of the channel between the source $S_i$ and the relay $R_j$. The joint detector MAPD-E (or multi-user detector (MUD)) based on the maximum a posteriori criterion receives the signal $y_{R_j,k}$ and exchanges information with the decoders $DecS_1$, $DecS_2$ to extract the information $\hat{u}_1$, $\hat{u}_2$ from each source. The exchange is applied to the detected bits and to the decoded bits. On each iteration, the decoders receive as input the intrinsic logarithmic likelihood ratios (LLRs) of the coded bits $\{L(c_i)\}$ and they deliver the extrinsic LLRs $\{E(c_i)\}$ on the coded bits $c_i$. After reinterleaving, the extrinsic LLRs $\{E(V_i)\}$ are used as a priori LLRs at the inputs of the detector. Iterations are stopped when the messages are perfectly decoded or after a certain number of iterations, which number can be set.

Figure 7:
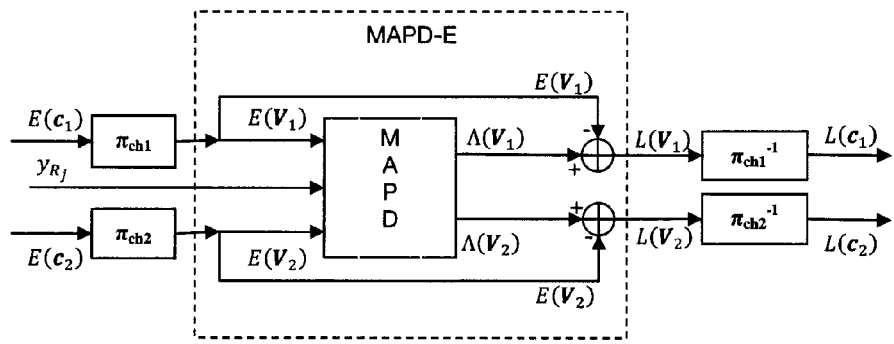
FIG. 7 is a diagram of a joint detector MAPD-E.

The joint detector MAPD-E is shown in FIG. 7. The multi-user detector implements the following equations:

$$\Lambda(v_{i,k,l}) = \log\left(\frac{P(v_{i,k,l}=1 \mid y_{R_j})}{P(v_{i,k,l}=0 \mid y_{R_j})}\right)$$

$$\approx \log \frac{\sum_{a \in \chi_i : \phi_{i,l}^{-1}(a)=1, b \in \chi_j} P(Y_{R_j} \mid x_{i,k}=a, x_{j,k}=b) e^{\xi(a)+\xi(b)}}{\sum_{a \in \chi_i : \phi_{i,l}^{-1}(a)=0, b \in \chi_j} P(Y_{R_j} \mid x_{i,k}=a, x_{j,k}=b) e^{\xi(a)+\xi(b)}}$$

where $(i,j) \epsilon \{1,2\}^2$ such that $i \neq j$ and:

$$\begin{cases} \xi(a) = \sum_{l'=1}^{\log_2(|\chi_i|)} \phi_{i,l'}^{-1}(a) E(v_{i,k,l'}) \\ \xi(b) = \sum_{l'=1}^{\log_2(|\chi_j|)} \phi_{j,l'}^{-1}(b) E(v_{j,k,l'}) \end{cases}$$

and where $E(v_{i,k,l'})$ is the extrinsic information of the bit $v_{i,j,l'}^1$ supplied by the decoder corresponding to the source $S_j$, the $l^{th}$ bit in the labeling corresponding to the symbol $x_{i,k}^1$.

The outputs from the joint detector are then described by: $L(V_i) = \Lambda(V_i) - E(V_i)$ where $\Lambda(V_i)$ is the log a posteriori probability ratio (LAPPR) on the bit $V_i$ and $E(V_i)$ is the extrinsic information from the decoder associated with the source $S_i$ of this bit.

Figure 8:
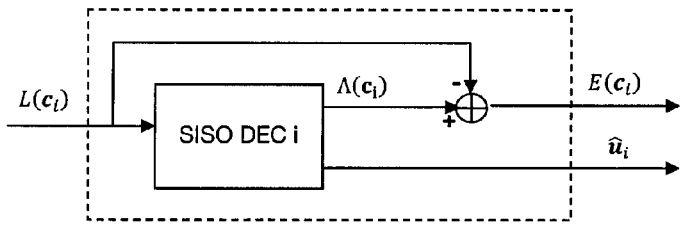
FIG. 8 is a diagram of a decoder $DecS_i$.

The decoder $DecS_i$ is shown in FIG. 8. It is a decoder with soft inputs and soft outputs, e.g. of the BCJR type [2]. The equations that characterize soft information exchange at the decoder are given by:

$$E(c_i) = \Lambda(c_i) - L(c_i)$$

where $\Lambda(c_i)$ is the LLR corresponding to the coded bit of the code word $c_i$, $L(c_i)$ is the a priori information about the bit, and $E(c_i)$, which is supplied to the detector, is the extrinsic information about this coded bit.

The error detector CRCji detects the errors so as to select only those messages that have been decoded without error. When there is systematic coding at the sources, the contents of the selected error-free messages correspond to the systematic bits of the code words detected without error.

The interleavers $\pi_{ji}$ are defined in the binary field, they are identical for a given relay given that the method implements joint network-channel coding. The interleavers $\pi_{ji}$ interleave the messages that have been detected without error from the source $S_i$ corresponding to the systematic bits of their respective code words, thus making it possible to create a distributed turbo code.

The binary-to-algebraic converters CBAji associate a number $n=\ln_2(q)$ of bits (where q is a power of 2 equal to the cardinality of the field, $\ln_2$ is the base 2 logarithm) with an element of the field defined by the network coding. Thus, in the example of a four-element Galois field $F_4$, the converters rely on the following bijective function:

$$s: \{1,0\} \times \{0,1\} \to F_4$$

which associates with two bits $(b_1, b_2)$ the symbol $q=s(b_1,b_2)$ of $F_4$.

This function and its inverse gives the binary representation of an element of $F_4$. The following notation is used below: $b_1 = s_1^{-1}(q)$ and $b_2 = s_2^{-1}(q)$ for $q=s(b_1,b_2)$.

The network coder $CR_j$ represented in FIG. 5 by a square with a cross performs the linear combination in the field $F_4$ of the messages from two sources as detected without error, interleaved, and converted into algebraic form. The network coding vectors of the relays $R_1$ and $R_2$ are respectively $[1,1]^T$ and $[1,2]^T$. The network coding $[n,m]^T$ defined by the vectors $[1,1]^T$ and $[1,2]^T$ performs the operation $n \cdot u_1 + m \cdot u_2$. The system formed by the independent equations $u_2+u_1$ and $u_1+2 \cdot u_2$ is invertible in $F_4$ and thus makes it possible to retrieve the messages $u_1$ and $u_2$ in the event of outages on the links $S_1$ to D and $S_2$ to D.

The algebraic-to-binary converters transform an element of the finite field into its binary representation, they implement the function that is the inverse of s.

The shaper module MCSj performs a modulation and coding scheme, which may for example be of the bit interleaving coding and modulation (BICM) type, that corresponds to concatenating binary channel coding (defined in the binary field), a binary interleaver, and bit-to-symbol Gray coding (modulator). The binary channel coding at the relays is based for example on recursive systematic codes (RSC). The vector of the coded bits is written:

$$c_{R_j} \in F_2^{n_{R_j}}.$$

In a particular implementation, channel coding is followed by a puncturing operation $\Omega$, which consists in the recursive systematic coder retaining only bits of determined parity. Under such circumstances, the overall efficiency is equal to $$\frac{n_{R_j}}{K}.$$

The coded and interleaved sequences are written:

$$V_{R_j} \in F_2^{Chuse_R \times s_{R_j}}.$$

The bit-to-symbol coding is described by $$\phi_j^R : F_2^{s_{R_j}} \to X_j^R,$$

where $\chi_j^R$ designates the constellation of symbols obtained with the order of the modulation being $$2^{s_{R_j}}.$$

The signal transmitted by the relay $R_j$ is written:

$$x_{R_j} \in \mathbb{C}^{Chuse_R}.$$

When the relays have a plurality of transmit antennas, shaping may for example be of the space-time bit interleaving coding and modulation (ST-BICM) type.

Figure 9:
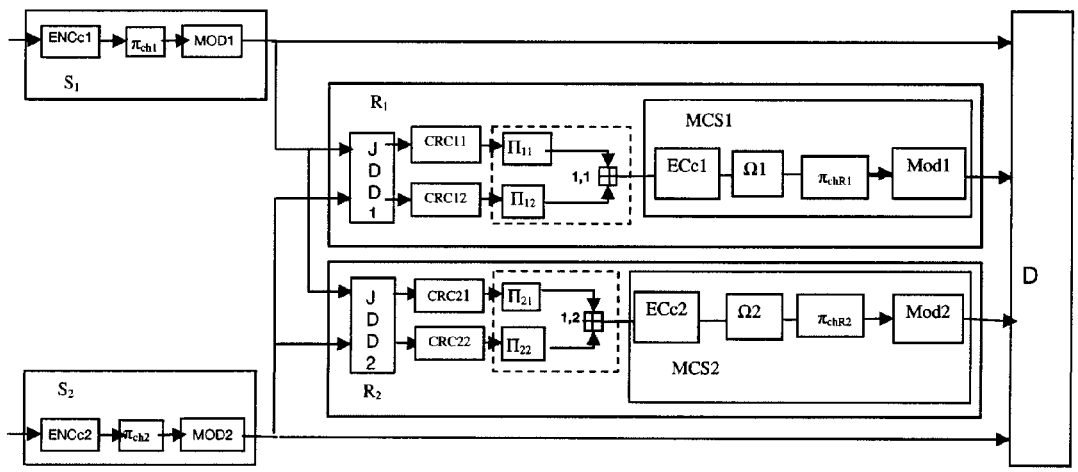
FIG. 9 is a diagram of a second embodiment of an MS-MR system of the invention in which the space-time modulation and coding schemes at the sources and at the relays are defined in the field defined by the algebraic network code.

In a second implementation of the invention, the space-time modulation and coding schemes at the sources and at the relays are defined in the field defined by the network coding. A particular implementation is shown in FIG. 9. In this second implementation, the modulation and coding schemes implemented at the sources and at the relays are defined directly by the field defined by the network coding, i.e. on a representation of the messages from the sources in the field. The example shown in FIG. 9 is identical to that of FIG. 5 except that the relays do not have a binary-to-algebraic converter, nor do they have an algebraic-to-binary converter, and except in that the shaper module MCSj shown corresponds to a particular implementation involving puncturing $\Omega j$.

The modulation and coding schemes are based on a scheme of the symbol interleaved coded modulation (SICM) type and corresponds to concatenating channel coding ECcj defined in the field $F_4$, a symbol interleaver $\pi_{chRj}$ (not binary) defined on $F_4$, and a modulator Modj performing Gray bit-to-symbol coding operating on the binary representations of the symbols of $F_4$. The example is described for the situation when $$s_i = \frac{w_i}{\ln_2(q)}$$

is an integer. Thus, a modulated symbol from the source i carries $s_i$ symbols of the field under consideration, i.e. the modulators may be considered as being bijective functions $\phi_i: F_4^{s_i} \to \chi_i$.

The detection and the decoding performed by the relay take place in a manner similar to that described above for the example corresponding to the binary implementation shown in FIGS. 5 to 8. The difference comes from the fact that the information exchanged between the detector and the decoders is now in the form of vectors. The linearity of the detection and decoding operations means that it is equivalent to applying on each component of these vectors the same operations as those described for the binary implementation.

The multi-user detector implements the following equations:

$$\Lambda_q(v_{i,k,l}) = \log\left(\frac{P(v_{i,k,l} = q \mid y_{R_j})}{P(v_{i,k,l} = 0 \mid y_{R_j})}\right)$$

$$\approx \log \frac{\sum_{a \in \chi_i : \phi_{i,l}^{-1}(a)=q, b \in \chi_j} P(Y_{R_j} \mid x_{i,k} = a, x_{j,k} = b) e^{\xi(a)+\xi(b)}}{\sum_{a \in \chi_i : \phi_{i,l}^{-1}(a)=0, b \in \chi_j} P(Y_{R_j} \mid x_{i,k} = a, x_{j,k} = b) e^{\xi(a)+\xi(b)}}$$

where $(i,j) \in \{1,2\}^2$ such that $i \neq j$ and:

$$\begin{cases} \xi(a) = \sum_{l'=1}^{\log_4(|\chi_i|)} \phi_{i,l'}^{-1}(a) E(v_{i,k,l'}) \\ \xi(b) = \sum_{l'=1}^{\log_4(|\chi_j|)} \phi_{j,l'}^{-1}(b) E(v_{j,k,l'}) \end{cases}$$

$E(v_{i,k,l'})$ is the extrinsic information supplied by the decoder corresponding to the source $S_i$, concerning the bit $v_{i,k,l'}$ relative to the value $\Phi_{i,l'}^{-1}(b)$ which is the $l'^{th}$ bit in the labeling corresponding to the symbol $x_{i,k}$. The output from the detector is then written by: $L(V_i) = \Lambda(V_i) - E(V_i)$ where $\Lambda(V_i)$ is the LAPPR of the word $V_i$ and $E(V_i)$ is the extrinsic information of this word from the decoder associated with the source $S_i$. The decoding takes place in a manner similar to that described with reference to FIG. 8.

Figure 10:
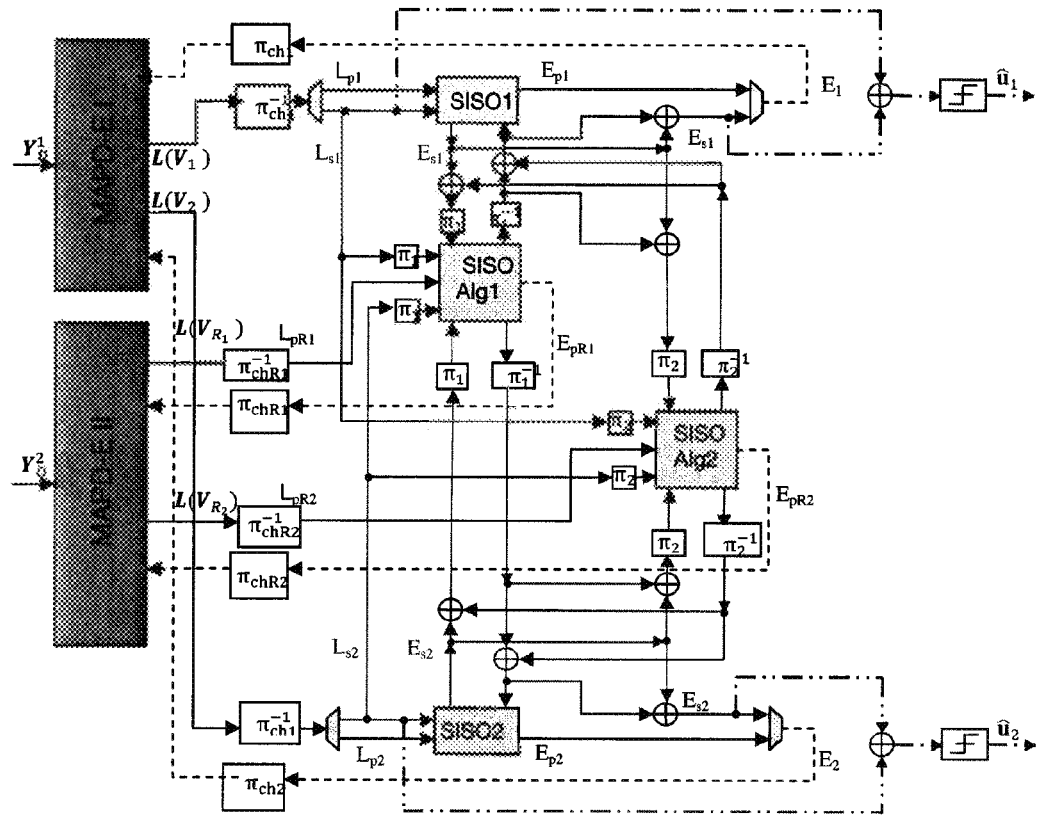
FIG. 10 is a diagram of a destination receiver of the invention.

FIG. 10 shows a destination receiver of the invention. It essentially comprises two stages: a detection stage followed by a decoding stage.

The detection stage performs multi-user iterative detection to detect messages coming directly from the sources during the first stage of the protocol and messages coming from the relays during the second stage of the protocol respectively by means of two detectors MAPD-EI and MAPD-EII. The two detectors provide soft information about the detected messages coming respectively from the sources and from the relays.

The decoding stage serves to decode messages respectively from the sources and from the relays on the basis of soft information taken a priori and coming from the detection stage. The decoding is performed by means of as many soft decoders SISO (soft input soft output) as there are sources and as many algebraic decoders SISO algj as there are algebraic network coders, and thus as there are relays. The decoders SISO1, SISO2, and the decoders SISO Alg1, SISO Alg2 are based on the codes implemented respectively in the sources and in the relays.

The soft decoders associated with the sources operate in totally identical manner with one another. Their operation is similar to that of the decoder described with reference to FIG. 8. FIG. 10 shows a demultiplexer between the output of the detector MAPD-EI and each of the soft decoders SISO1, SISO2, and it enables the systematic portion to be distinguished from the parity portion of the code, whereas in FIG. 8 the single input of the decoder implicitly includes both portions. Compared with the decoder of FIG. 8, the difference comes from taking account of the parity information supplied by the algebraic decoders associated with the relays.

The decoders provide soft information about the decoded symbols to the detectors. An iterative exchange of soft information takes place between the decoders associated with the sources and the algebraic decoders associated with the relays, thereby giving rise to joint iterative network channel decoding.

On each iteration, the two detectors generate LAPPRs on the coded bits coming from the sources and from the relays. The SISO decoders accept these intrinsic logarithmic likelihood ratios $L(c_1)$, $L(c_2)$, $L(c_{R_1})$, and $L(c_{R_2})$ of the coded bits and deliver extrinsic logarithmic likelihood ratios $E(c_1)$, $E(c_2)$, $E(c_{R_1})$, and $E(c_{R_2})$ about the coded bits.

The soft information of the systematic bits and of the parity bits corresponding to the sequence transmitted by the source $i$ are written $L_{Si}$ and $L_{pi}$. Let $L_{SiRj}$ be the soft information provided by the relay $R_j$ for the systematic bits from the source $S_i$. The corresponding extrinsic information is written $E_{Si}$, $E_{pi}$, $E_{SiRj}$.

The decoder SISO Algj is a decoder having soft inputs and outputs that incorporate a logic (algebraic) operation corresponding to the linear transform of the network coding of the relay $R_j$ under consideration.

Figure 11:
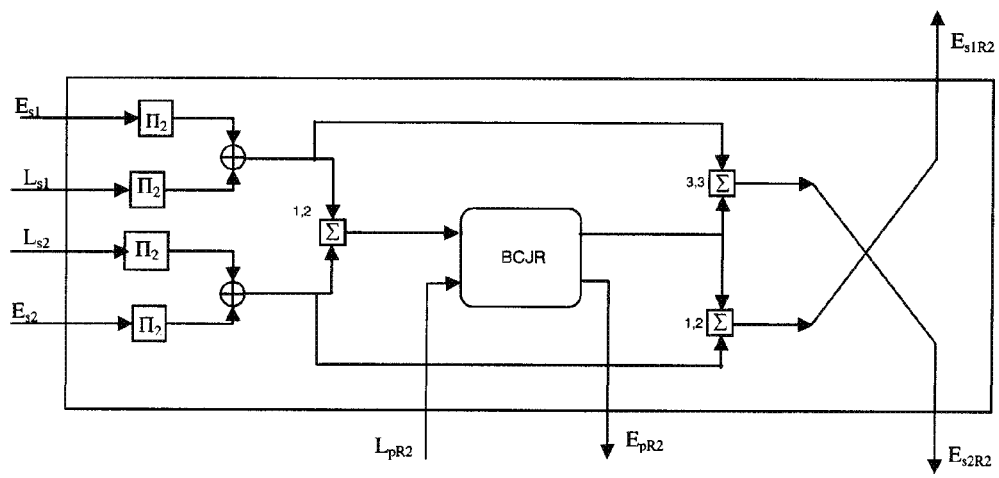
FIG. 11 is a diagram of an embodiment of the SISO decoder Algj when all of the transmissions are performed in the field $F_4$, i.e. in the second embodiment shown in FIG. 9 in which the channel coding is of the algebraic type.

FIG. 11 is a diagram of an embodiment of the SISO decoder Algj when all of the transmissions are performed in the field $F_4$, i.e. in the second implementation shown in FIG. 9 where the channel coding is of the algebraic type. In the example shown, the network coding corresponds to the relay $R_j = R_2$ which performs the linear combination $u_R = u_1 + 2 \cdot u_2$. The messages from the sources $u_1$ and $u_2$ represented in $F_4$ are detected without error at the relays, and thus $u_R = u_1 + 2 \cdot u_2$ is included in the parity bits transmitted by the relay $R_2$. The decoder with soft inputs and outputs SISO Alg2 corresponding to the relay under consideration receives as input a priori information about the parity symbols (because of the punching, only the parity bits are transmitted by the relays) from the relay $L_{pR}$ together with a priori information about the symbols from the two sources $u_1$ and $u_2$ (included in the systematic portions of the code words from the sources) which are $E_{S_1}' = \Pi E_{S_1} + \Pi L_{S_1}$ and $E_{S_2}' = \Pi E_{S_2} + \Pi L_{S_2}$. This a priori information $E_{S_1}'$ and $E_{S_2}'$ about the symbols from the two sources is used to calculate a priori information about the systematic symbols at the input of the channel coding of the relay by using the relationship modeled by the operator $1,2\Sigma$ in FIG. 11:

$E'_{SR,k} = \Sigma_{1,2,k}(E'_{S1}, E'_{S2})$ where $k \in F_4 = \{0,1,2,3\}$ represents the relationship $u_R = u_1 + 2 \cdot u_2$. Let $E'_{SR}$ be the set $\{E'_{SR,k}: k=0, 1, 3, 4\}$. From the (four component) vector $E'_{SR}$ and $L_{pR}$ the decoder outputs the extrinsic information for the parity symbols $E_{pR2}$ from the relay $R_2$ under consideration and for the systematic symbols from both sources: $E_{SiR2}$ which are associated by the following relationships modeled by the operators $1,2\Sigma$ and $3,3\Sigma$ in FIG. 11:

$E_{S1R2} = (\Sigma_{1,2,k}(E_{SR}, E'_{S2}))_{k=\{0,1,2,3\}}$ representing
$u_1 = u_R + 2 \cdot u_2$ and $E_{S3R2} = (\Sigma_{3,3,k}(E_{SR}, E'_{S1}))_{k=\{0,1,2,3\}}$ representing
$u_2 = 3 \cdot u_R + 3 \cdot u_1$.

Figure 12:
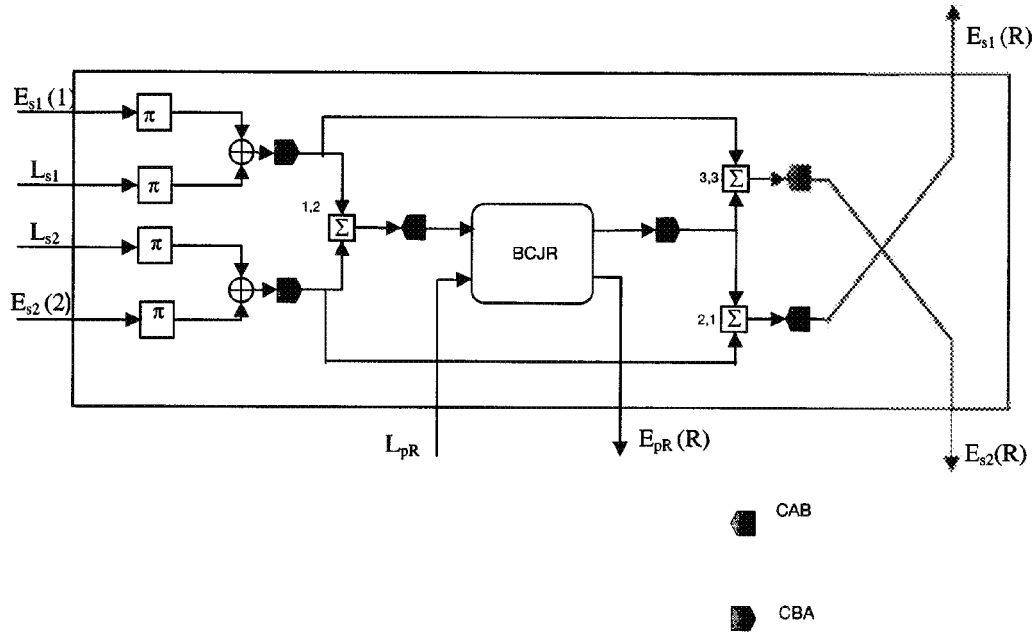
FIG. 12 is a diagram of an embodiment of the SISO decoder Alg for binary channel code, i.e. as in the first embodiment shown in FIG. 5.

FIG. 12 is a diagram of an embodiment of the SISO decoder Algj for binary channel coding, i.e. as in the first embodiment shown in FIG. 5. Operation is on the same principle as that of the SISO decoder Algj shown in FIG. 11 corresponding to algebraic transmission and described above. The difference comes from adding binary-to-algebraic converters CBAs (bit to symbol) at the input of the operators $\Sigma$ and algebraic-to-binary converters CABs (symbol to bit) at the output from the operators $1,2\Sigma$, $2,1\Sigma$, and $3,3\Sigma$. The binary-to-algebraic converters act on the extrinsic information from the sources in order to retain channel decoding at binary level. The LLRs and the extrinsic information are in the binary domain. Let $u = s(u_1, u_2)$ be an element of $F_4$, let $q \in F_4$, and let $$\Lambda_q(u) = \log\left(\frac{P(u=q)}{P(u=0)}\right)$$

be the LLR of u corresponding to the value q. The bit-to-symbol converters CBAs perform the operation that consists in determining the LLR of the symbol u knowing the LLRs of the bits $$(u_i)_{i\in\{1,2\}}$$
$$\forall q \in F_4,$$
$$\Lambda_q(u) = \sum_{i\in\{1,2\}} s_i^{-1}(q) \Lambda(u_i)$$
where $\Lambda(u_i) = \log\left(\frac{P(u_i=1)}{P(u_i=0)}\right)$ At the output from the operators 1,2Σ, 2,1Σ, and 3,3Σ, the symbol-to-bit converters CABs perform the operation that consists in determining the two LLRs associated with each of the bits of the symbol u:

$$\Lambda(u_i) = \log\left(\frac{\sum_{q\in F_4, s_i^{-1}(q)=1} e^{(\Lambda_q(u))}}{\sum_{q\in F_4, s_i^{-1}(q)=0} e^{(\Lambda_q(u))}}\right), i \in \{1, 2\}$$

The decoder shown corresponds to a relay, the relay that transmits only the parity bits and that punctures the systematic bits.

The BCJR decoder of FIG. 12, like that of FIG. 11, operates on the two-element finite field like the associated channel coding. Only the binary-to-algebraic and algebraic-to-binary converters and the operators Σ operate in the field $F_4$.

The basic arrangement of a receiver of the invention is described below for the special case corresponding to an embodiment of relays in which the systematic bits are punctured at the relays.

1/ The detector MAPD-EI receives as input the multiplexed extrinsic information of the systematic and parity bits respectively from the two sources. Thus, it receives $E_1 = [E_{S_1} + \Pi_1^{-1} E_{S_1R_1} + \Pi_2^{-1} E_{S_1R_2}, E_{p_1}]$ and $E_2 = [E_{S_2} + \Pi_1^{-1} E_{S_2R_1} + \Pi_2^{-1} E_{S_2R_2}, E_{p_2}]$. As output it supplies the LLRs of each of the bit sequences received from the two sources $[L_{S_1}, L_{p_1}]$ and $[L_{S_2}, L_{p_2}]$.

2/ The detector MAPD-EII receives as input the extrinsic information on the parity bits from the two relays $E_{pR1}$ and $E_{pR2}$. It outputs the LLRs of these sequences $L_{pR1}$ and $L_{pR2}$.

3/ The decoders SISO1 and SISO2 receive as input the LLRs of the respective systematic and parity bits from the associated two sources coming from the detectors, together with the extrinsic information about their respective systematic bits from the algebraic decoders SISO Alg1 and SISO Alg2. This extrinsic information constitutes a priori information about the systematic bits from the two sources. Thus, SISO1 receives $L_{p_1}$ and $L_{s_1}$ from the detector MAPD-EI and as a priori information about the systematic bits it receives: $\Pi_1^{-1} E_{S_1R_1} + \Pi_2^{-1} E_{S_1R_2}$. It calculates the LLRs: $\Lambda_{S_1}$ and $\Lambda_{p_1}$, and from them together with $L_{s_1}$ and $L_{p_1}$ it deduces the extrinsic information $E_{s_1}$ and $E_{p_1}$ that it delivers as output. SISO2 is symmetrical with SISO1.

4/ The SISO Alg1 is then activated. As input it receives the extrinsic information about the systematic bits from the sources $S_1$ and $S_2$ supplied by the two channel decoders SISO1 and SISO2 together with the extrinsic information calculated at the preceding iteration by the decoder SISO Alg2: $\Pi_1(E_{s_1} + \Pi_2^{-1} \cdot E_{s_1R_2})$ and $\Pi_1(E_{s_2} + \Pi_2^{-1} \cdot E_{s_2R_2})$. It also receives as input the a priori information about the systematic bits generated by the multi-user detector MAPD-EI: $\Pi_1 \cdot L_{s_1}$ and $\Pi_1 \cdot L_{s_2}$. It also receives as input the LLRs $L_{pR1}$ of the parity bits coming from the first relay $R_1$ supplied by the detector MAPD-EII. The decoder outputs the extrinsic information $E_{pR_1}$ about the parity bits from the relay $R_1$ together with the extrinsic information about the systematic bits from the sources $S_1$ and $S_2$: $E_{s_1R_1}$ and $E_{s_2R_1}$. The decoders SISO Alg2 and SISO Alg1 are symmetrical in their operation, but each of them contains a decoder that is specific to their respective algebraic operations. The provision of the extrinsic information $E_{pR_2}$ about the parity bits of the relay $R_2$ and also the extrinsic information $E_{s_1R_2}$ and $E_{s_2R_2}$ about the systematic bits from the sources $S_1$ and $S_2$ by the decoder SISO Alg2 terminates the first iteration.

The return to detection step 1/ marks the beginning of the following iteration.

At the end of the iterative process, the method takes from the outputs of the decoders and of the detectors, firstly $L_{s_1} + E_{s_1} + \pi_1^{-1} E_{S_1R_1} + \Pi_2^{-1} E_{S_1R_2} \lessgtr 0$ in order to proceed with taking a decision about $\hat{u}_1$, and secondly $L_{s_2} + E_{s_2} + \Pi_1^{-1} E_{S_2R_1} + \Pi_2^{-1} E_{S_2R_2} \lessgtr 0$ in order to proceed with taking a decision about $\hat{u}_2$. The sign $\lessgtr$ means that if the output is positive then the decision is that $\hat{u}_1$ or $\hat{u}_2$ is one, and if the output is negative then the decision is that $\hat{u}_1$ or $\hat{u}_2$ is zero.

The following examples serve to illustrate how the destination receiver uses the information transmitted in-band by the relays. This information specifies which messages have been detected without error by the relays. On the basis of this information, the receiver disconnects or does not disconnect an algebraic decoder of a SISO decoder associated with a source, or it deactivates an algebraic decoder.

Figure 13:
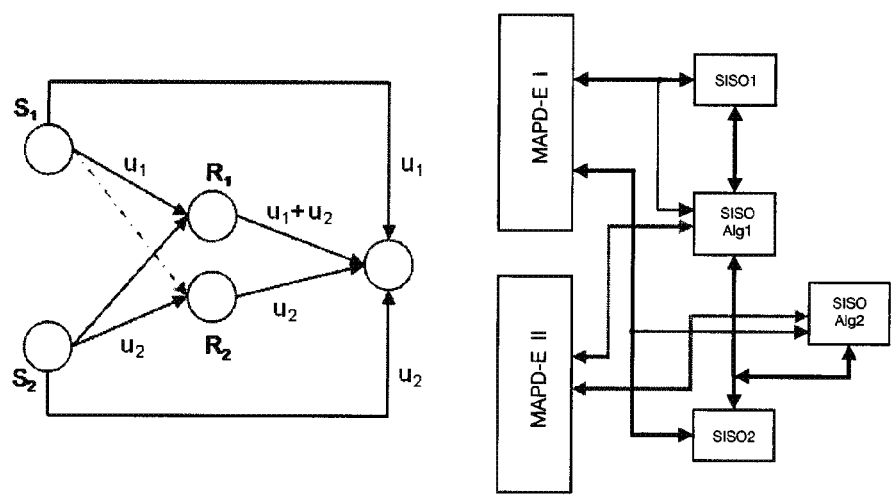
FIGS. 13 to 15 are diagrams showing the adaptive structure of the receiver as a function of the in-band information transmitted by the relays.

In the first example shown in FIG. 13: one of the two relays, the relay $R_2$ sends only of the source signals, the signal $u_2$. Under such circumstances, the algebraic SISO decoder SISO alg2 corresponding to the relay $R_2$ is disconnected from the SISO decoder SISO1 of the non-coded source $S_1$.

Figure 14:
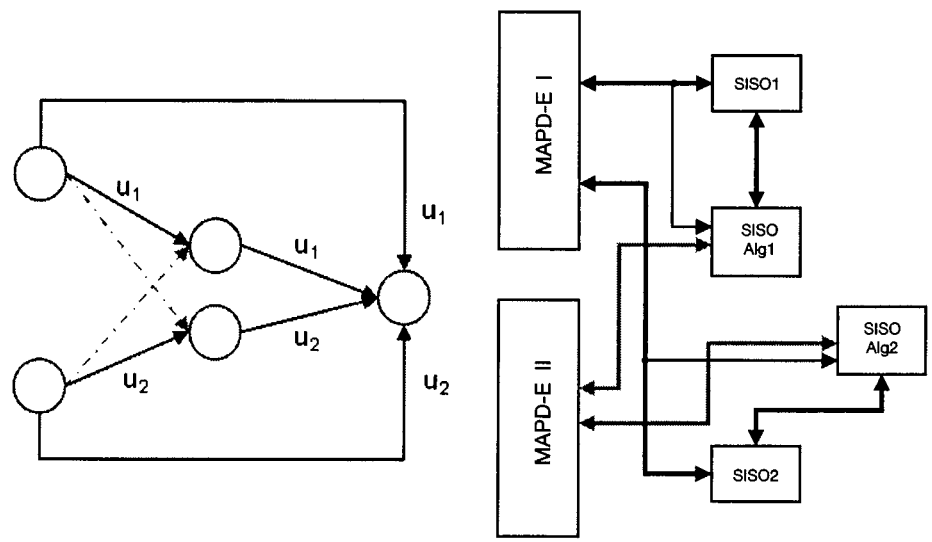

A second situation is shown in FIG. 14: each relay $R_1$, $R_2$ sends only one source signal. The SISOi is then disconnected from the decoder SISO Algj where i is the index of the source $S_i$ that is not coded by the relay $R_j$.

Figure 15:
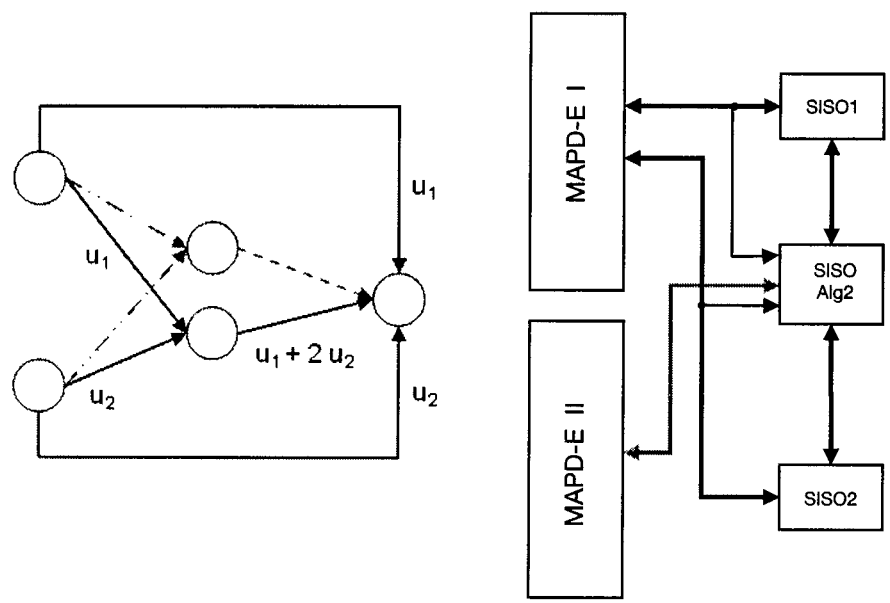

A third situation is shown in FIG. 15: one of the two relays, the relay $R_1$, does not send any source signal. Under such circumstances, the algebraic SISO decoder SISO alg1 corresponding to the relay $R_1$ is deactivated.

APPENDIX A

A.1 Field $F_4$

The primitive polynomial at the origin of the elements of this field is $X^2 + X + 1$. Let $\alpha$ and $\alpha^2$ be the two roots of this polynomial, and use the notations 0 and 1 respectively for the neutral elements respectively of addition and multiplication for this field. Decimal notation is used for these elements: $\{0, 1, 2, 3\}$ where 2 and 3 represent $\alpha$ and $\alpha^2$, respectively.

TABLE 1

| (+) | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

| (×) | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 | a) Addition Table for $F_4$  b) Multiplication Table for $F_4$

Let $x_1$, $x_2$, and $y$ be three elements of $F_4$ such that: $x_1 + 2 \cdot x_2 = y$. The transformations that enable $x_1$ and $x_2$ to be determined are given by:

$$\begin{cases} x_1 = y + 2 \cdot x_2 \\ x_2 = 3 \cdot y + 3 \cdot x_1 \end{cases}$$

The notation $S_{n,m,i}$ is used for the set of pairs $(k,l)$ of $F_4$ that are solutions to the equation given by $n \cdot k + m \cdot l = i$. Thus:

$$S_{n,m,i} = \{(k,l) \in (F_4)^2, \; n \cdot k + m \cdot l = i\}$$

The notation $\Sigma_{n,m,i}$ is used for the function defined by:

$$\mathbb{R}^4 \times \mathbb{R}^4 \to \mathbb{R}$$

$$(x, y) \to \mathrm{Log}\left(\frac{\sum_{(k,l) \in S_{n,m,i}} \mathrm{Exp}(x_k + y_l)}{\sum_{(k,l) \in S_{n,m,0}} \mathrm{Exp}(x_k + y_l)}\right)$$

A.2 Algebraic Magnitudes

A.2.1. LLR

LLR is the logarithm of the likelihood ratio or probability ratio relating to two symbols.

In the binary version, a bit u may be 1 or 0. Such a ratio is given by a scalar:

$$LLR = \log\left(\frac{P(u=1)}{P(u=0)}\right)$$

and its sign defines in unique manner the hard decision about the bit u.

In the algebraic version, e.g. in $F_4$, a symbol u may have four different values. A scalar LLR cannot designate the symbol u in unique manner. We therefore introduce a vector LLR of size four defined as follows:

$$\forall q \in F_4,$$

$$LLR_q(u) = \log\left(\frac{P(u=q)}{P(u=0)}\right)$$

The first component is zero since u=0 is considered to be the reference event relative to which the likelihoods of the other events are calculated.

A.2.2. LAPPR

The log a posteriori probability ratio (LAPPR) is a form of LLR that is "conditional" on "side information" that is typically provided by a received sequence.

In the binary version, LAPPR is defined by:

$$LAPPR = \log\left(\frac{P(u=1 \mid y)}{P(u=0 \mid y)}\right)$$

In the algebraic version, e.g. in $F_4$, use is made of a vector LAPPR of size four defined as follows:

$$\forall q \in F_4,$$

$$LAPPR_q(u) = \log\left(\frac{P(u=q \mid y)}{P(u=0 \mid y)}\right)$$

[1] M. Xiao, M. Skoglund, "*Design of Network Codes for Multiple Users Multiple Relays Wireless Networks*", IEEE International Symposium on Information Theory, 2009.

[2] L. Bahl, J. Cocke, F. Jelinek, and J. Raviv, "Optimal Decoding of Linear Codes for minimizing symbol error rate", IEEE Transactions on Information Theory, vol. IT 20(2), pp. 284-287, March 1974

The invention claimed is:

1. A method of semi-orthogonal transmission of a signal, for use in a system having N sources, M relays, and a single receiver wherein simultaneous transmission over a common spectrum resource by each of the M relays takes place successively and non-simultaneously with simultaneous transmission over the same spectrum resource by the sources, the method comprising for each of the M relays $R_j$, $1 \leq j \leq M$:
    iterative joint detection and decoding coded source messages transmitted respectively by the sources to obtain decoded source messages;
    detecting errors in the decoded source messages;
    interleaving only the decoded source messages that are detected without error, followed by algebraic network coding of coding vector $a_j = [a_{1,j} \; a_{2,j} \ldots a_{N,j}]^T$ including a linear combination in a finite field of order strictly greater than two of the interleaved decoded source messages to obtain a relay message, the linear combinations being independent in pairs between the relays of the system; and
    shaping comprising channel coding the relay message, to obtain the signal representative of the relay message.

2. A method according to claim 1, further including shaping a control signal identifying the decoded source messages involved in the algebraic network coding.

3. A method according to claim 1, wherein the channel coding is systematic.

4. A method according to claim 1, wherein the channel coding is binary, and further comprising:
    binary-to-symbol conversion between the interleaving step and the algebraic coding step; and
    symbol-to-binary conversion after the algebraic network coding step.

5. A method according to claim 1, wherein the finite field of order strictly greater than two is a Galois field of order four.

6. A method according to claim 1, wherein detecting errors is performed using redundancy information of a cyclic type associated with the coded source messages transmitted by the sources.

7. A method according to claim 1, wherein iterative joint detection and decoding jointly performs multi-user detection and soft input and soft output decoding.

8. A method according to claim 1, wherein the iterative joint detection and decoding implement space-time decoding.

9. A method according to claim 1, wherein the shaping further comprises interleaving and modulation, after channel coding, to obtain the signal representative of the relay message.

10. A method according to claim 1, wherein algebraic network coding by the M relays is represented by a systematic generator matrix $T=[I_N G]$ with $I_N$ being an identity matrix of dimension N and with G being a matrix of the M network coding vectors $a_j=[a_{1,j}\ a_{2,j}\ \ldots\ a_{N,j}]^T$, wherein the components of the network coding vectors are determined by independent random drawing in such a manner that maximum diversity of the system is reached.

11. A non-transitory data medium including program instructions stored thereon and adapted to implement a method of semi-orthogonal transmission of a signal, when said program is loaded in and executed by a relay for a system having N sources, M relays, and a single receiver, wherein simultaneous transmission over a common spectrum resource by each of the relays takes place successively and non-simultaneously with simultaneous transmission over the same spectrum resource by the sources, and wherein the method comprises:
 iterative joint detection and decoding coded source messages transmitted respectively by the sources to obtain decoded source messages;
 detecting errors in the decoded source messages;
 interleaving only the decoded source messages that are detected without error, followed by algebraic network coding with a coding vector $a_j=[a_{1,j}\ a_{2,j}\ \ldots\ a_{N,j}]^T$ including a linear combination in a finite field of order strictly greater than two of the interleaved decoded source messages to obtain a relay message, the linear combinations being independent in pairs between the relays of the system; and
 shaping comprising channel coding of the relay message, to obtain the signal representative of the relay message.

12. A relay $R_j\ j\in(1, \ldots, M)$ for a semi-orthogonal system having N sources, M relays $R_j$, $1\leq j\leq M$, and a single receiver for implementing a method of semi-orthogonal transmission of a signal, wherein simultaneous transmission over a common spectrum resource by each of the M relays takes place successively and non-simultaneously with simultaneous transmission over the same spectrum resource by the sources, the relay $R_j$ comprising:
 means for iterative joint detection and decoding coded source messages transmitted respectively by the sources to obtain decoded source messages;
 means for detecting errors in the decoded source messages;
 interleaving means for interleaving only those decoded source messages that are detected without error;
 means for algebraic network coding of coding vector $a_j=[a_{1,j}\ a_{2,j}\ \ldots\ a_{N,j}]^T$ including a linear combination of the interleaved decoded source messages in a finite field of order strictly greater than two to obtain a relay message, the linear combinations being independent between the relay and each one of the other relays of the system; and
 means for shaping, comprising channel coding means for channel coding the relay message, to obtain the signal representative of the relay message.

13. A system having the N sources, the M relays, and the single semi-orthogonal receiver, wherein the relays are relays according to claim 12.

14. A reception method for a receiver of a semi-orthogonal system having N sources and M relays, the system being for implementing a method of semi-orthogonal transmission of a signal, wherein simultaneous transmission over a common spectrum resource by the M relays takes place successively and non-simultaneously with simultaneous transmission over the same spectrum resource by the N sources, the reception method comprising in iterative manner:
 a first multi-user detection for detecting N coded source messages transmitted simultaneously by the respective N sources to obtain intrinsic soft information about the respective N coded source messages;
 a second multi-user detection for detecting M relay messages transmitted respectively by the relays to obtain intrinsic soft information about the respective M relay messages which were obtained at the relays by algebraic network coding decoded source messages detected without error by the relays;
 N soft decoding, in parallel, the N coded source messages; and
 M soft algebraic network decoding, in cascade, the M relay messages under control of information received from the relays identifying the decoded source messages involved in the algebraic network coding at the relays;
 wherein the N soft decoding uses the intrinsic soft information coming from the first multi-user detection as a priori information in order to provide extrinsic soft information about the source messages involved in the M relay messages decoded in the M soft algebraic network decoding;
 wherein the M soft algebraic network decoding uses the intrinsic soft information coming from the first and second multi-user detections as a priori information and provides extrinsic soft information about the decoded relay messages to the second multi-user detection; and
 wherein the N soft decoding and the M soft algebraic network decoding supplying each other mutually with the extrinsic soft information they provide, this mutual supply being under control of information coming from the relays identifying the decoded source messages involved in the algebraic network coding at the relays.

15. A receiver for a semi-orthogonal system having N sources and M relays, the system being for implementing a method of semi-orthogonal transmission of a signal, wherein simultaneous transmission over a common spectrum resource by the M relays takes place successively and non-simultaneously with simultaneous transmission over the same spectrum resource by the N sources, and the receiver comprising:
 first detection means for multi-user joint detection to separate the simultaneous streams of N coded source messages coming respectively from the N sources during a first stage of transmission and to generate intrinsic soft information about the N coded source messages;
 second detection means for multi-user joint detection to separate the simultaneous streams of relay messages coming respectively from the M relays during a second stage of transmission and to generate intrinsic soft information about the relay messages which were obtained at the relays by algebraic network coding decoded source messages detected without error by the relays;

N soft decoders in parallel for soft decoding the respective N coded source messages while using the intrinsic soft information coming from the first detection means as a priori information in order to generate extrinsic soft information about the decoded source messages;

M soft algebraic network decoders operating in cascade for soft decoding the relay messages while using the intrinsic soft information coming from the first and second detection means as a priori information in order to supply extrinsic soft information about the decoded relay messages to the second detection means;

the N soft decoders and the M soft algebraic network decoders iteratively supplying each other mutually with extrinsic soft information, this mutual supply being under control of information coming from the relays identifying the decoded source messages involved in the algebraic network coding at the relays; and decision-taking means for the N soft decoders to obtain after some iterations of the mutual supply with the M soft algebraic network decoders an estimate of the source messages.

* * * * *

UNITED STATES PATENT AND TRADEMARK OFFICE
CERTIFICATE OF CORRECTION

PATENT NO. : 9,634,797 B2
APPLICATION NO. : 14/367719
DATED : April 25, 2017
INVENTOR(S) : Meryem Benammar et al.

It is certified that error appears in the above-identified patent and that said Letters Patent is hereby corrected as shown below:

In the Specification

In Column 14, Line 30, please replace the Equation:

$$\approx \log \frac{\sum_{a \in \chi_i : \phi_{i,l}^{-1}(a)=1, b \in \chi_j} P(Y_{R_j} | x_{i,k}=a, x_{j,k}=b) e^{\xi(a)+\xi(b)}}{\sum_{a \in \chi_i : \phi_{i,l}^{-1}(a)=0, b \in \chi_j} P(Y_{R_j} | x_{i,k}=a, x_{j,k}=b) e^{\xi(a)+\xi(b)}}$$

With:

$$\approx \log \frac{\sum_{a \in \chi_i : \phi_{i,l}^{-1}(a)=1, b \in \chi_j} P\left(Y_{R_j} \middle| x_{i,k}=a, x_{j,k}=b\right) e^{\xi(a)+\xi(b)}}{\sum_{a \in \chi_i : \phi_{i,l}^{-1}(a)=0, b \in \chi_j} P\left(Y_{R_j} \middle| x_{i,k}=a, x_{j,k}=b\right) e^{\xi(a)+\xi(b)}}$$

In Column 17, Line 1, please replace the Equation:

$$\approx \log \frac{\sum_{a \in \chi_i : \phi_{i,l}^{-1}(a)=q, b \in \chi_j} P(Y_{R_j} | x_{i,k}=a, x_{j,k}=b) e^{\xi(a)+\xi(b)}}{\sum_{a \in \chi_i : \phi_{i,l}^{-1}(a)=0, b \in \chi_j} P(Y_{R_j} | x_{i,k}=a, x_{j,k}=b) e^{\xi(a)+\xi(b)}}$$

With:

$$\approx \log \frac{\sum_{a \in \chi_i : \phi_{i,l}^{-1}(a)=q, b \in \chi_j} P\left(Y_{R_j} \middle| x_{i,k}=a, x_{j,k}=b\right) e^{\xi(a)+\xi(b)}}{\sum_{a \in \chi_i : \phi_{i,l}^{-1}(a)=0, b \in \chi_j} P\left(Y_{R_j} \middle| x_{i,k}=a, x_{j,k}=b\right) e^{\xi(a)+\xi(b)}}$$

Signed and Sealed this
Fifth Day of March, 2019

Andrei Iancu
*Director of the United States Patent and Trademark Office*

CERTIFICATE OF CORRECTION (continued)
U.S. Pat. No. 9,634,797 B2

In Column 19, Line 25, please replace the Equation:

$$\Lambda(u_i) = \log\left(\frac{\sum_{q \in F_4, s_i^{-1}(q)=1} e^{(\Lambda_q(u))}}{\sum_{q \in F_4, s_i^{-1}(q)=0} e^{(\Lambda_q(u))}}\right), i \in \{1, 2\}$$

With:

$$\Lambda(u_i) = \log\left(\frac{\sum_{q \in F_4, s_i^{-1}(q)=1} e^{(\Lambda_q(u))}}{\sum_{q \in F_4, s_i^{-1}(q)=0} e^{(\Lambda_q(u))}}\right), i \in \{1, 2\}$$

In Column 21, Line 35, please replace the Equation:

$$(x, y) \to \text{Log}\left(\frac{\sum_{(k,l) \in S_{n,m,i}} \text{Exp}(x_k + y_l)}{\sum_{(k,l) \in S_{n,m,0}} \text{Exp}(x_k + y_l)}\right)$$

With:

$$(x, y) \to \text{Log}\left(\frac{\sum_{(k,l) \in S_{n,m,i}} Exp(x_k + y_l)}{\sum_{(k,l) \in S_{n,m,0}} Exp(x_k + y_l)}\right)$$